(12) United States Patent
Jung et al.

(10) Patent No.: US 7,585,746 B2
(45) Date of Patent: Sep. 8, 2009

(54) PROCESS INTEGRATION SCHEME OF SONOS TECHNOLOGY

(75) Inventors: Sung Mun Jung, Singapore (SG); Yoke Leng Louis Lim, Singapore (SG); Sripad Nagarad, Singapore (SG); Dong Kyun Sohn, Singapore (SG); Dong Hua Liu, Singapore (SG); Xiao Yu Chen, Singapore (SG); Rachel Low, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 295 days.

(21) Appl. No.: 11/485,949

(22) Filed: Jul. 12, 2006

(65) Prior Publication Data
US 2008/0014707 A1 Jan. 17, 2008

(51) Int. Cl.
H01L 21/76 (2006.01)
(52) U.S. Cl. .................. 438/424; 438/257
(58) Field of Classification Search .......... 438/424, 438/257; 257/E21.683
See application file for complete search history.

(56) References Cited

U.S. PATENT DOCUMENTS

| | | | |
|---|---|---|---|
| 5,168,334 A | 12/1992 | Mitchell et al. | |
| 5,424,569 A | 6/1995 | Prall | |
| 5,622,881 A | 4/1997 | Acocella et al. | |
| 6,008,112 A | 12/1999 | Acocella et al. | |
| 6,753,570 B1 | 6/2003 | Tripsas et al. | |
| 6,818,508 B2 | 11/2004 | Shimizu et al. | |
| 6,946,349 B1 | 9/2005 | Lee et al. | |
| 2002/0063277 A1 | 5/2002 | Ramsbey et al. | |
| 2003/0075773 A1 | 4/2003 | Deml et al. | |
| 2005/0142801 A1 | 6/2005 | Lee | |
| 2005/0236660 A1* | 10/2005 | Watanobe et al. | 257/315 |
| 2005/0236680 A1 | 10/2005 | Yoo | |
| 2006/0063329 A1* | 3/2006 | Chu et al. | 438/257 |
| 2006/0240635 A1* | 10/2006 | Shiraiwa et al. | 438/424 |
| 2007/0115725 A1* | 5/2007 | Pham et al. | 365/185.18 |

* cited by examiner

Primary Examiner—Bradley K Smith
(74) Attorney, Agent, or Firm—Horizon IP Pte Ltd

(57) ABSTRACT

In an non-limiting example, we provide a substrate having a cell region, and non-cell regions. We form a tunneling dielectric layer, a charge storing layer, a top insulating layer (e.g., ONO), over the substrate. Then we form a conductive pad layer over the top insulating layer. We form isolation trenches in the pad layer, the charge storing layer and the tunneling dielectric layer and into the substrate. We form isolation regions in the isolation trenches. We remove the pad layer, charge storing layer and the tunneling dielectric layer in the non-cell regions. We form a gate layer over the pad layer and the substrate surface. We complete to form the memory (e.g., SONOS) device in the cell region and other devices in the non-cell regions of the substrate.

15 Claims, 7 Drawing Sheets

PROCESS INTEGRATION SCHEME OF SONOS TECHNOLOGY

BACKGROUND OF INVENTION

1) Field of the Invention

Embodiments of this invention relates generally to a structure and method for forming a semiconductor memory device and more particularly to a SONOS memory device.

2) Description of the Prior Art

Semiconductor memory devices in general can be divided into two types: a random access memory (RAM) and a read only memory (ROM). The RAM, such as a dynamic random access memory (DRAM) and a static access memory (SRAM), is fast to input and output data and is volatile such that previously stored data is removed after a predetermined time has passed or power turn-off. Although the ROM keeps data once it is stored, it is slow to input and output data. The ROM includes a Rom, a programmable ROM (PROM), an erasable PROM (EPROM), and an electrically erasable PROM (EEPROM). Recently, there is an increasing demand for EEPROM being capable of electrically programming or removing data. The EEPROM or a cell of a flash memory having a bulk erasing function has a stack type gate structure in which a floating gate and a control gate are stacked.

Meanwhile, a quantum trap device has been the center of public attention as a nonvolatile SRAM or a flash memory for a next generation device. The quantum trap device has a silicon-oxide-nitride-oxide-silicon (SONOS) structure. Operation of the SONOS device having the SONOS structure is divided into reading, programming, and erasing. In the case of programming, when a program voltage is applied to the gate of the transistor and a drain of the cell, a hot electron is formed and then surrounded by a nitride film being at an area adjacent to the drain. Thus, a threshold voltage of the transistor is increased. Therefore, data programming is performed.

In case of erasing operation, when the gate, the drain and the source are opened and an erasing voltage is applied to the semiconductor substrate, the electrode surrounded by the nitride film is pushed away from the semiconductor substrate. Thus, the threshold voltage is lowered. Therefore, the data erasing is performed.

In the case of reading operation, a reading voltage is applied to the gate, and an electric current flowing through a space between the source and the drain is sensed by a sensing circuit. Accordingly, the data reading is performed.

In the case of the SONOS, since program/removal characteristics and retention characteristics must be traded off with each other, it is impossible to improve the program/removal characteristic and the retention characteristic simultaneously. Accordingly, a proper trade off point between the removing characteristic and the retention characteristic is desired so as to optimize an oxide-nitride-oxide layer of the SONOS.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

US20050142801A1: Method for manufacturing semiconductor device—Inventor: Lee, Kae Hoon; Mapo-gu, Republic of Korea U.S. Pat. No. 6,753,570: Memory device and method of making—Inventor Muragishi et U.S. Pat. No. 6,818,508: Non-volatile semiconductor memory device and manufacturing method thereof.

U.S. Pat. No. 6,008,112: Method for planarized self-aligned floating gate to isolation Floating gate area formation for semiconductor non-volatile memory device—Inventor Acocella, Joyce Molinelli U.S. Pat. No. 5,424,569: Array of non-volatile sonos memory cells—Inventor: Prall, Kirk;

U.S. Pat. No. 5,622,881: Packing density for flash memories—Inventor: Acocella, Joyce E.;

US20020063277A1: Planar structure for non-volatile memory devices—Inventor: Ramsbey, Mark T.;

U.S. Pat. No. 5,168,334: Non-volatile semiconductor memory Single transistor cell non-volatile semiconductor memory—Inventor: Mitchell, Allan T.; Garland, Tex.

US20050236680A1: EEPROM and method of fabricating the same—Inventor: Yoo, Tae-kwang US20030075773A1: Semiconductor memory device—Inventor: Deml, Christoph; Munich U.S. Pat. No. 6,946,349: Method for integrating a SONOS gate oxide transistor into a logic/analog integrated circuit having several gate oxide thicknesses—Inventor: Lee, Jae Gon;

SUMMARY OF THE INVENTION

The following presents a simplified summary in order to provide a basic understanding of some aspects of some example embodiments of the invention. This summary is not an extensive overview of the example embodiments or the invention. It is intended neither to identify key or critical elements of the invention nor to delineate the scope of the invention. Rather, the primary purpose of the summary is to present some example concepts of the invention in a simplified form as a prelude to the more detailed description that is presented later.

The example embodiments of the present invention provides a structure and a method of manufacturing a memory device which is characterized as follows.

providing a substrate having a cell region, and a non-cell region;

forming a charge storing film over the substrate;

forming a pad layer over the charge storing film; the pad layer is comprised of a conductive material;

forming isolation trenches through the pad layer, and the charge storing film and into the substrate at least in portions of the cell region;

forming isolation regions in the isolation trenches;

forming a gate layer over the pad layer and the substrate surface;

patterning the charge storing film, the pad layer, and the gate layer to from memory gate structures in the cell region.

Another aspect of an example embodiment is as follows. We provide a substrate having a cell region, a thick gate dielectric region, and a thin gate dielectric region. We form a tunneling dielectric layer, a charge storing layer, a top insulating layer,over the substrate. Then we form a pad layer and a pad insulating layer over the top insulating layer. The pad layer is comprised of a conductive material that can be later incorporated into a gate electrode. We form isolation trenches in the pad dielectric layer, pad layer,charge storing layer and the tunneling dielectric layer and the substrate. We form isolation regions in the isolation trenches. We remove the pad dielectric layer. We removing the pad dielectric layer, pad layer,charge storing layer and the tunneling dielectric layer in the non-cell regions. We form a gate layer over the pad layer and the substrate surface. We complete forming the SONOS device in the cell region and other devices in the non-cell regions of the substrate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

The example embodiments of the present invention will be described in detail with reference to the accompanying drawings. The example embodiments provide a method of forming a memory device such as a SONOS memory device. In the description below the abbreviation ONO is meant to comprise current or future configurations of a charge storing non-conductive multi-layered film such as a tunnel dielectric/charge storing/top insulating films used in semiconductor memory devices.

I. First Example Embodiment

The first example embodiment provides a structure and a method for the fabrication of a semiconductor device.

A feature of some example embodiments is to deposit the charge storing film (e.g., ONO) prior to shallow trench isolation (STI) etch and fill process. Instead of pad oxide and pad nitride for normal STI process, in embodiments, the charge storing film (e.g., ONO), gate pad (e.g., poly Pad) and pad nitride film are deposited sequentially, in which ONO and gate pad are used in the SONOS cell. The embodiment's charge storing film (e.g., ONO) quality is improved because the gate pad layer is preferably deposited next after charge storing film deposition. This keeps the charge storing film clean.

In the example embodiment below the charge storing film is described as a ONO film. It is understood that other film configurations and compositions can be used. The charge storing film can be a multi-layered non-conductive charge storing film.

A. Provide a Substrate

Figure 1:
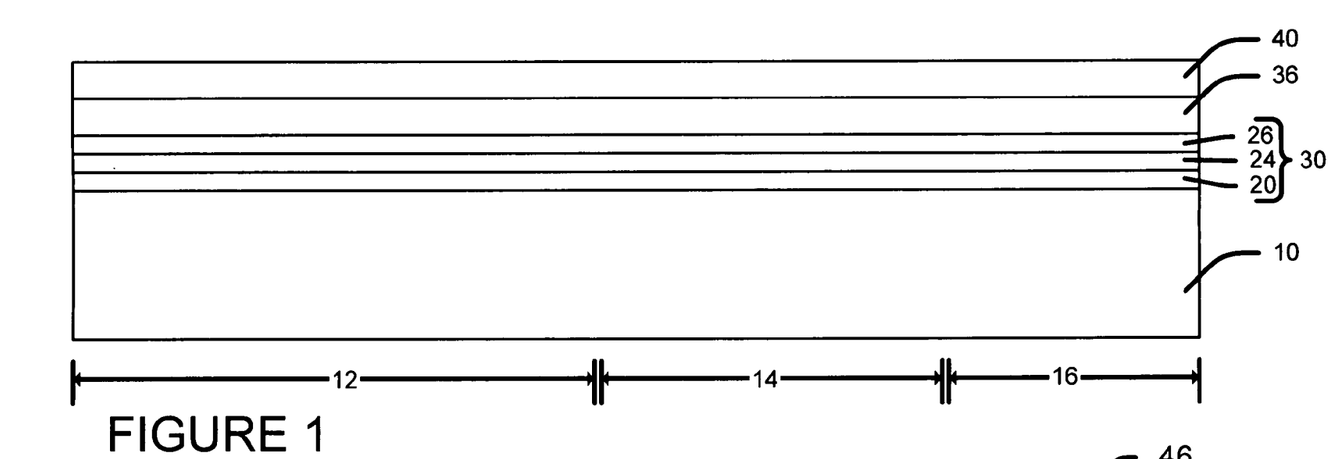
FIGS. 1, 2, 3, 4, 5, 6, 7 and 8 are cross sectional views for illustrating a method for manufacturing a memory device according to an example embodiment of the present invention.

Referring to FIG. 1, we provide a substrate 10 having a cell region 12, a thick gate dielectric region 14, and a thin gate dielectric region 16. Logic devices can be formed in the non-cell regions, such as the thick gate dielectric region 14, and the thin gate dielectric region 16.

The substrate can be any substrate used in semiconductor manufacturing such as a silicon wafer.

Next, a charge storing film 30 is formed over the substrate. Below we describe an example embodiment using a ONO layer, but other layers can be used.

B. Form a Tunneling Dielectric Layer Over the Substrate

Next, we form a tunneling dielectric layer 20 over the substrate 10. The tunneling dielectric layer 20 can be comprised of silicon oxide, oxinitride or any other dielectric material and is preferably comprised of silicon oxide. The tunneling dielectric layer 20 can have a thickness between 20 and 80 angstroms.

C. Form a Charge Storing Layer

We then form a charge storing layer 24 over the tunneling dielectric layer 20. The charge storing layer 24 can be comprised of silicon nitride or oxynitride and is preferably comprised of silicon nitride.

The charge storing layer 24 can have a thickness between 30 and 120 angstroms.

D. Form a Top Insulating Layer

We form a top insulating layer 26 over charge storing layer 24.

The top insulating layer can be comprised of silicon oxide, or any other suitable dielectric material and preferably of silicon oxide. The top insulating layer 26 can have a thickness between 40 and 200 angstroms.

The tunneling dielectric layer 20, the charge storing layer 24, and the top insulating layer 26, when comprised of oxide, nitride, and oxide, respectively can be called an ONO layer. The embodiments are not limited to the 3 layers, nor to the composition of oxide, nitride and oxide, but can be comprised of more than 3 layers and can be comprised of any current or future developed layer configuration to for the memory device.

E. Form a Pad Layer Over the Top Insulating Layer

We form a (conductive) pad layer 36 over the top insulating layer 26. The pad layer 36 is comprised of a conductive material that can be later incorporated into a gate electrode. The pad layer 36 can be comprised of polysilicon, or silicide or a combination of polysilicon and silicide, and is preferably comprised of polysilicon.

The pad layer 36 can have a thickness between 500 and 2000 angstroms

F. Form an Optional Pad Dielectric Layer Over the Pad Layer

We form an optional pad dielectric layer 40 over the pad layer 36. The pad dielectric layer 40 can be comprised of nitride, or oxynitride, and is preferably comprised of nitride.

The pad dielectric layer 40 can have a thickness between 0 and 3000 angstroms.

G. Form Isolation Trenches

Figure 2:
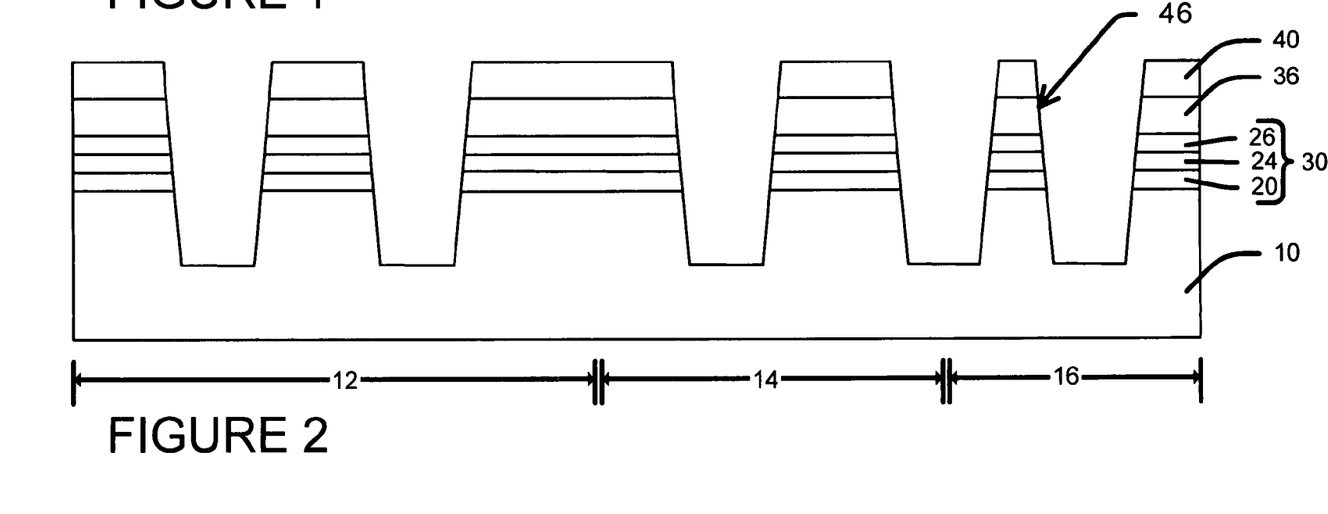

Referring to FIG. 2, we form isolation trenches 46 in the pad dielectric layer 40, the pad layer 36, the charge storing layer 24 and the tunneling dielectric layer 20 and the substrate 10. The isolation trenches 46 can be formed to isolate the cell region 12, a thick gate dielectric region 14, and a thin gate dielectric region 16. The isolation trench define active areas of the substrate where device can be formed.

H. Form Isolation Regions in the Isolation Trenches

Figure 3:
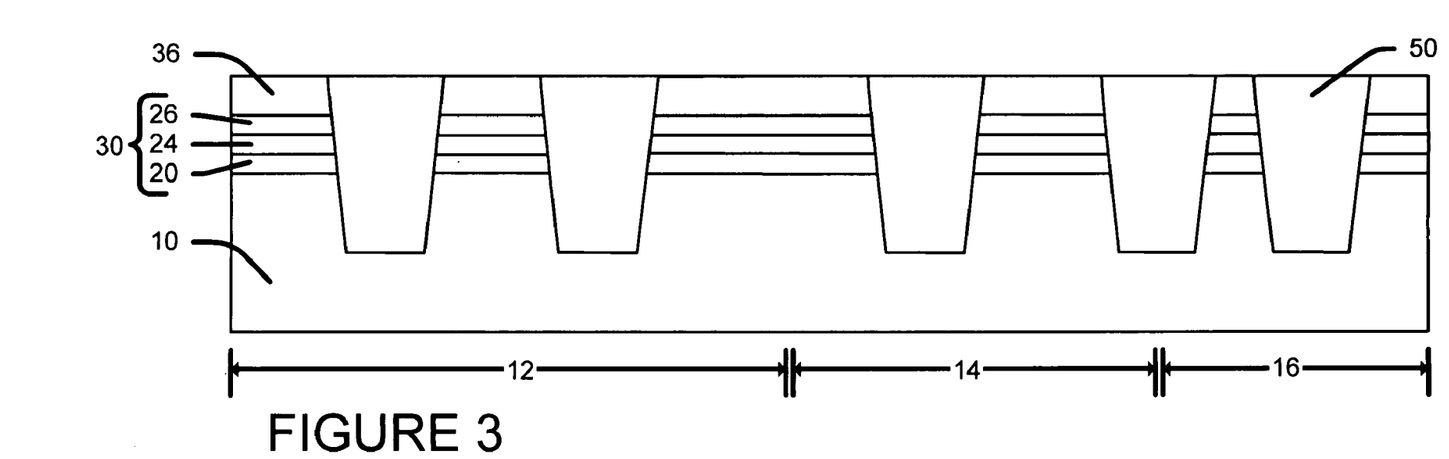

Referring to FIG. 3, we form isolation regions 50 in the isolation trenches 46. The isolation regions can be formed by filling the trenches with a dielectric layer, such as oxide, (e.g., HDPCVD) and chemical-mechanical polishing (CMP) the dielectric layer down to and possibly through the pad dielectric layer 40.

I. Remove the Pad Dielectric Layer

We can remove any remaining optional pad dielectric layer 40 if present, for example using a selective etch.

Figure 4:
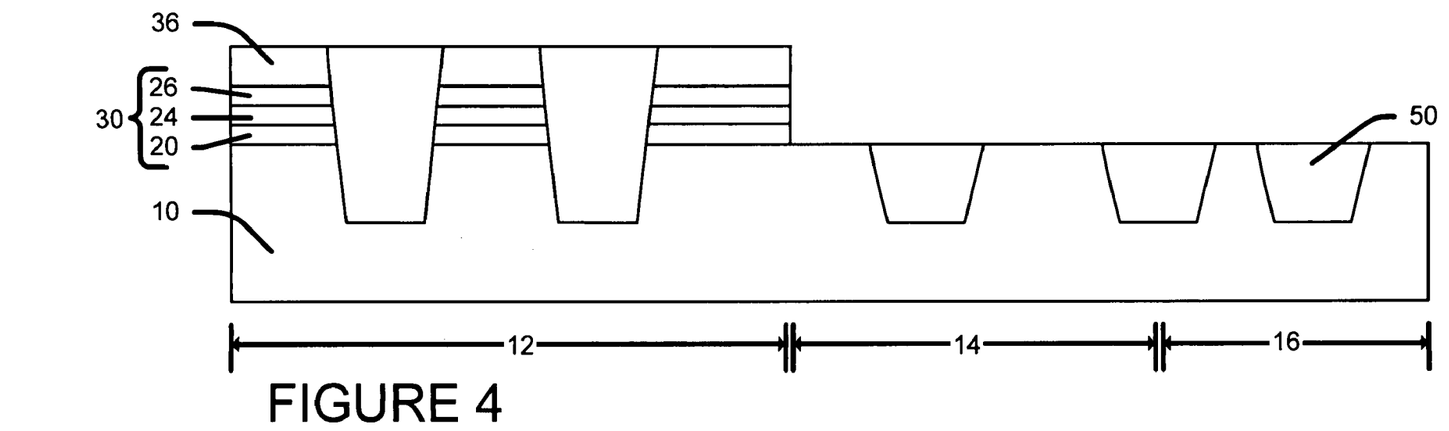

J. Remove the Charge Storing Layer and the Tunneling Dielectric Layer in the Thick Gate Dielectric Region and the Thin Gate Dielectric Region Referring to FIG. 4, we remove the pad layer 36, the charge storing layer 24 and the tunneling dielectric layer 20 in regions outside of the cell region 12. For example, the layers are removed in the thick gate dielectric region 14 and the thin gate dielectric region 16. The layers can be removed by forming a using a cell mask (e.g., resist mask) over the cell region 12 and etching the layers. Then the cell mask is removed, for example using an ashing step.

K. Form Gate Dielectric Layers Outside of the Cell Region

Figure 5:
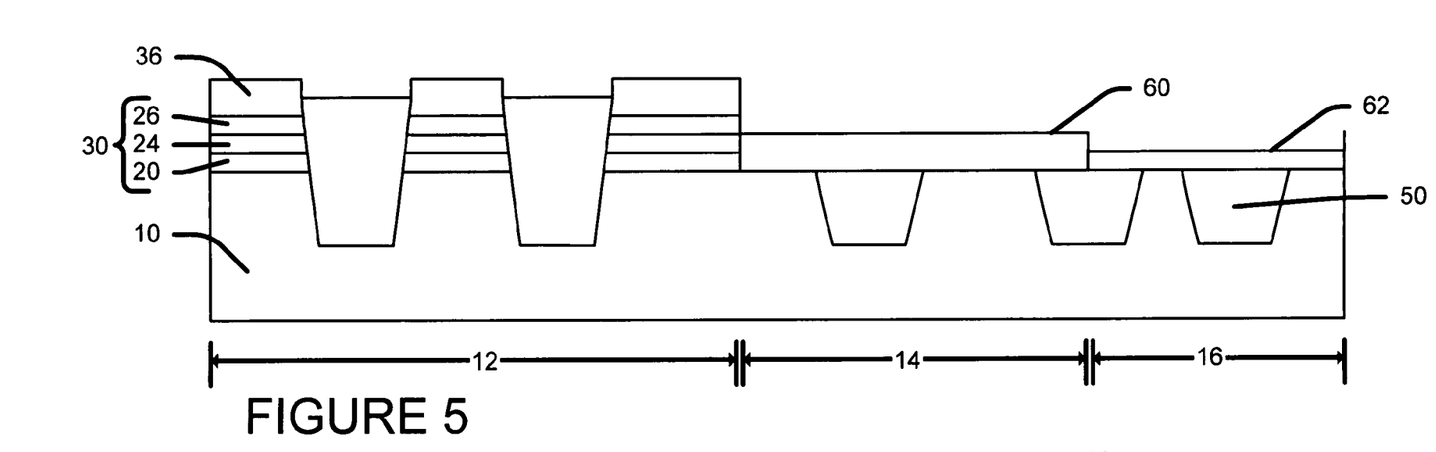

Referring to FIG. 5, we form gate dielectric layers on the areas outside of the cell region 12. For example, we can form a thick gate dielectric layer 60 in the a thick gate dielectric region 14 and a thin gate dielectric layer 62 in the thin gate dielectric region 16. Additional regions with different gate dielectric characteristic can be formed.

L. Form a Gate Layer Over the Pad Layer and the Substrate Surface

Figure 6:
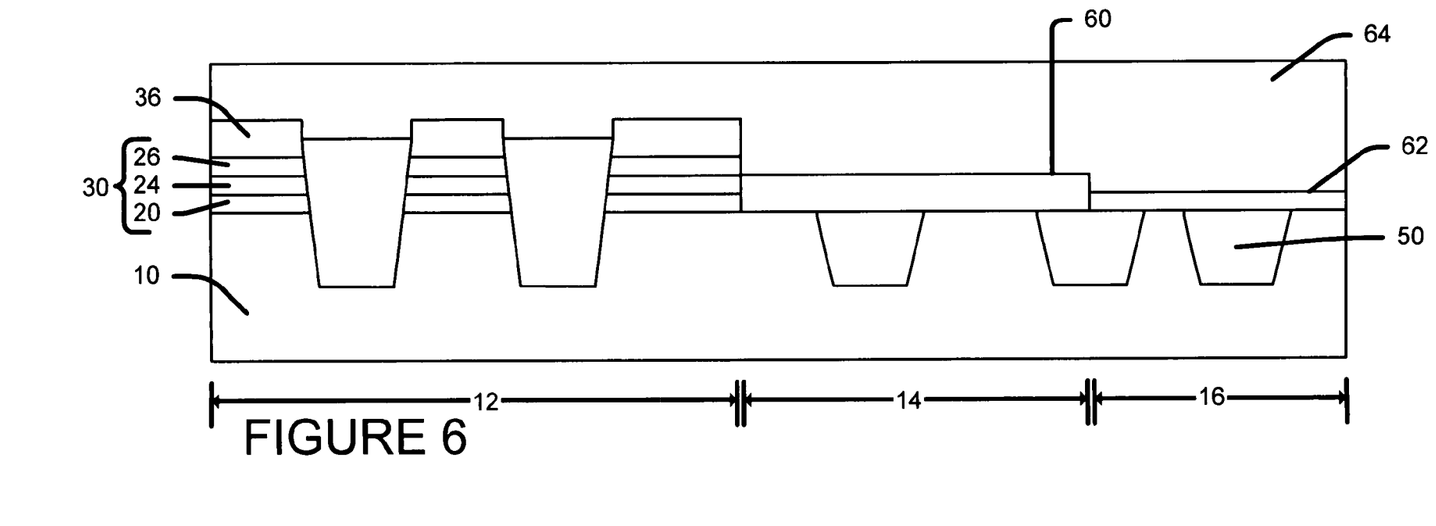

Referring to FIG. 6, we form a (conductive) gate layer 64 over the pad layer and the substrate surface.

The gate layer can be comprised of polysilicon, or any suitable conducting material and preferably polysilicon.

M. Complete the Memory Devices and Other Devices

Figure 7:
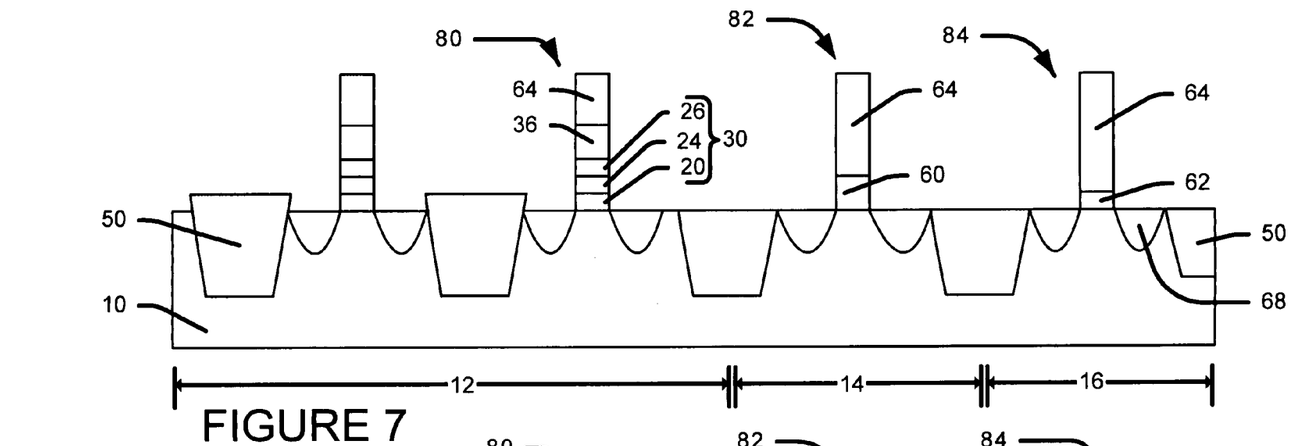

Referring to FIG. 7, we pattern the layers 20 24 26 30 36 64 to form SONOS gate structures 80 in the cell region 12, thick gate dielectric gate structure 82 in the thick gate oxide region 14 and thin gate dielectric gate structure 84 in the thin gate dielectric region 16.

Next, we form source and drain regions 68 adjacent to the gate structures 80 82 84. The source and drain regions 68 can be different concentrations and depths for the different regions 12 14 16 and device types (e.g., P & N FETs, thick and thin gate dielectric FETs, etc). Other regions can be formed (not shown in figures). A memory device is comprised of the source and drain regions 68 and the memory gate structure 80. The memory device can be a nitride storage memory device, a dielectric film storage memory device, a non-conductive film storage device or a SONON storage memory device.

Figure 8:
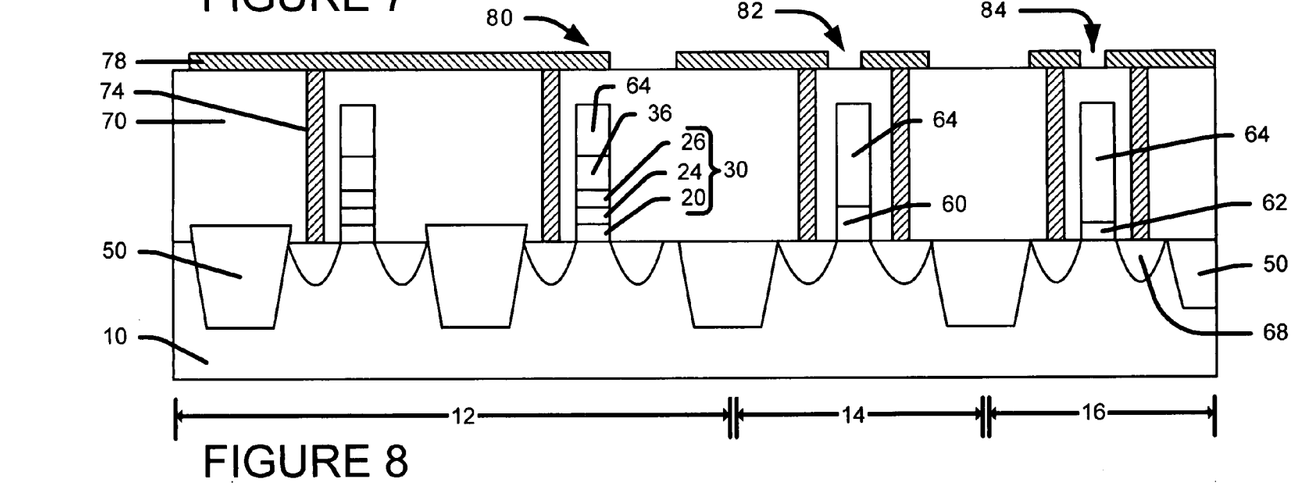

Referring to FIG. 8, we form a dielectric layer 70 (e.g., interlevel dielectric (ILD) layer) over the substrate 10 surface. Next, contact holes are formed thru the dielectric layer to form contacts 74 to the appropriate structures, such as source/drain regions 68 and gates (not shown).

Next, interconnects 78 are formed over the dielectric layer and the contacts 74.

N. Dual Gate Technology

In the some Si-based logic process technology, dual gate oxide process is followed by STI and well formation. In case of applying SONOS process into the logic compatible process, the processes related to ONO film have to be inserted right before dual gate oxide after STI process.

In this case, we have found that SONOS technology suffers from 2 difficulties:
First, the ONO top oxide quality is degraded during dual gate oxide process, because ONO film is exposed to chemical etchant several times.
Second, the nitride film N (in the ONO stack ) adheres to sidewall of STI couldn't be removed using existing etch technique, because the vertical thickness of this film is too thick to etch out using dry etch. This nitride stringer acts as blocking layer at subsequent poly etch step, and causes poly bridge when the devices are completed.

FIGS. 9A through 9E shows cross sectional views of a process known to the inventors that causes a poly bridge shorting problem. The process forms the ONO layer over the STI region and then etches the ONO layer. A nitride stringer (e.g., 934A in FIG. 9B) on the sidewalls of the STI regions causes a poly stringer 950A to be formed in a subsequent poly patterning step.

Figure 9A:
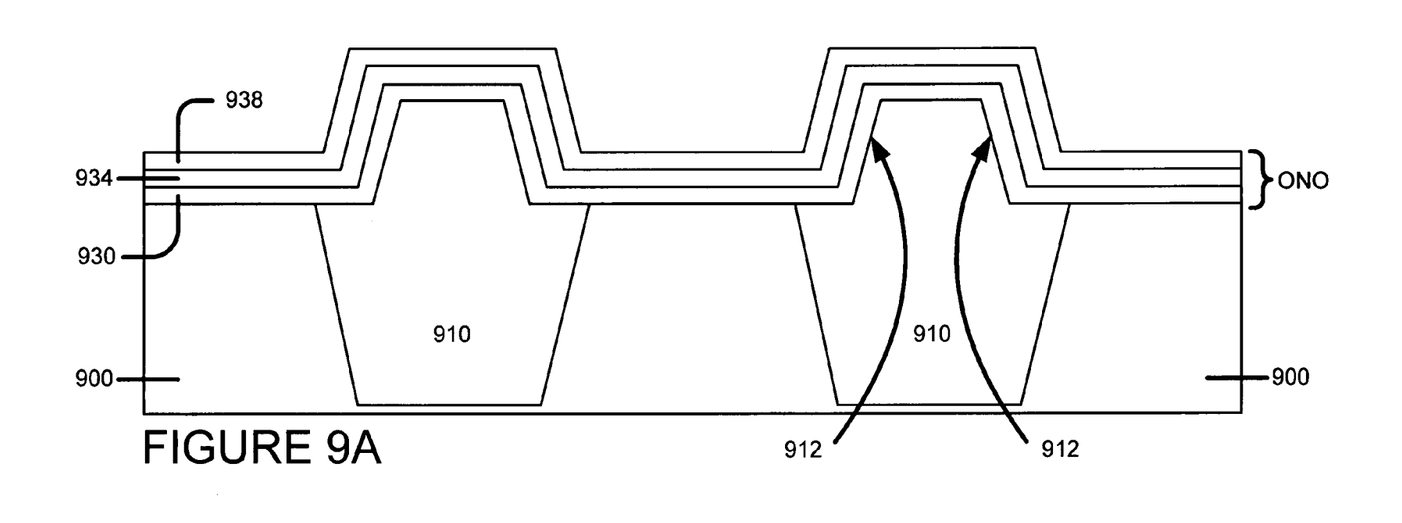
FIGS. 9A, 9B, 9C 9D and 9E are cross sectional views for illustrating a method for forming a memory device according to a process known to the inventors.

FIG. 9A shows a ONO layer 930 934 938 formed over STI regions 910 in a substrate 900.

Figure 9B:
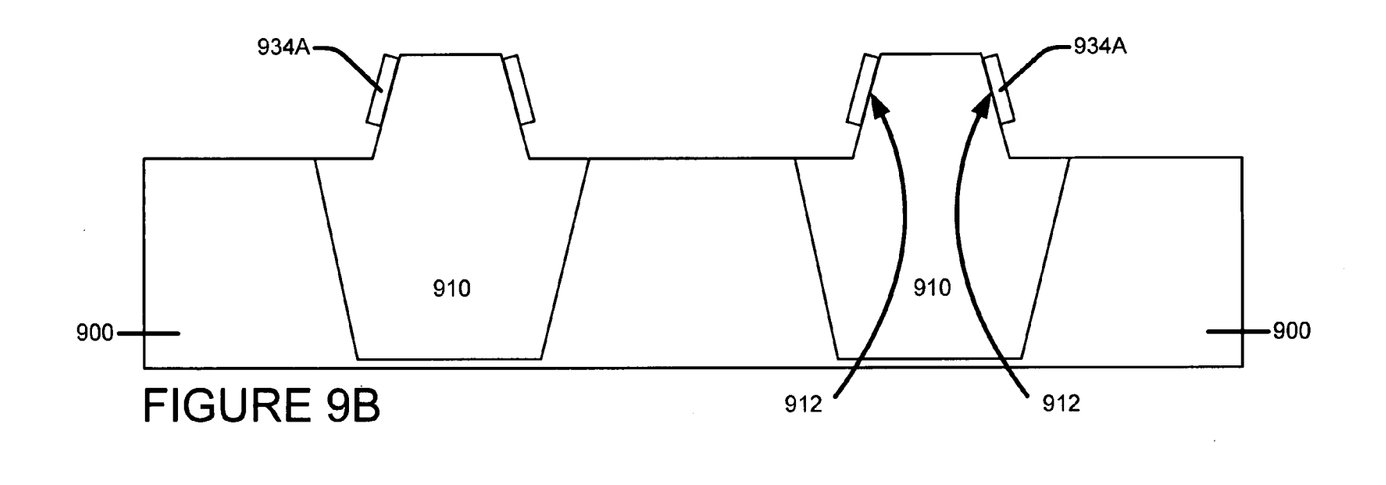

FIG. 9B shows a ONO etch that leaves a nitride stringer 934A on the sidewalls 912 of the STI regions 910. In FIGS. 9B to 9E, the O layer 930 is shown as part of the oxide STI 910. The ONO etch, which is an anisotropic etch (dry etch), cannot fully remove the ONO film adheres to STI sidewall, because its vertical thickness is much thicker than that of other region.

Figure 9C:
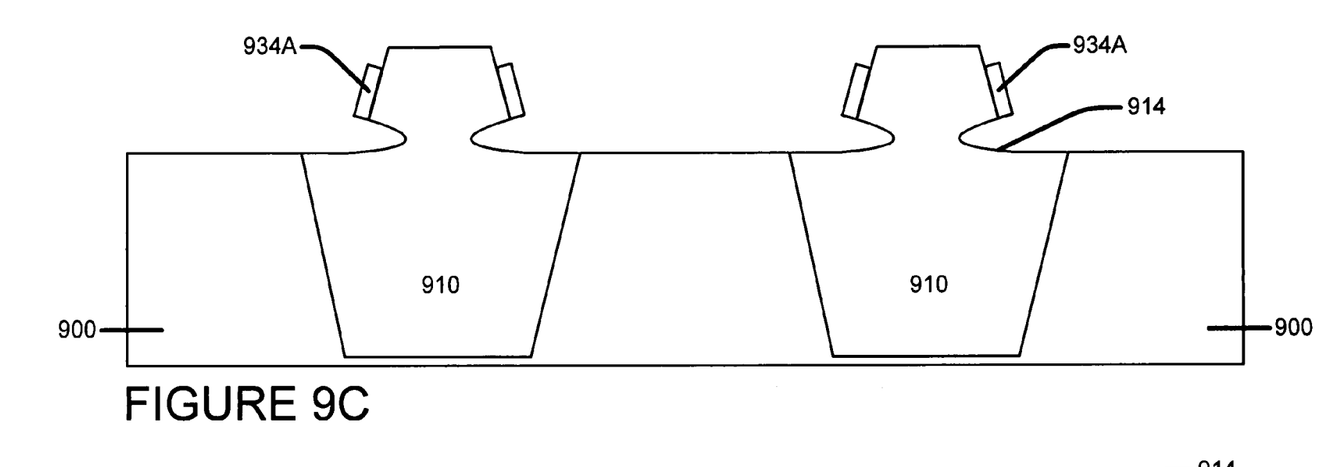

FIG. 9C shows a gate oxide pre clean step that forms a small hole 914. The wet chemical such as HF for gate oxide pre-cleaning removes a certain of STI oxide as shown in the FIG. 9C. Here, nitride 934A cannot be etched out at all.

Figure 9D:
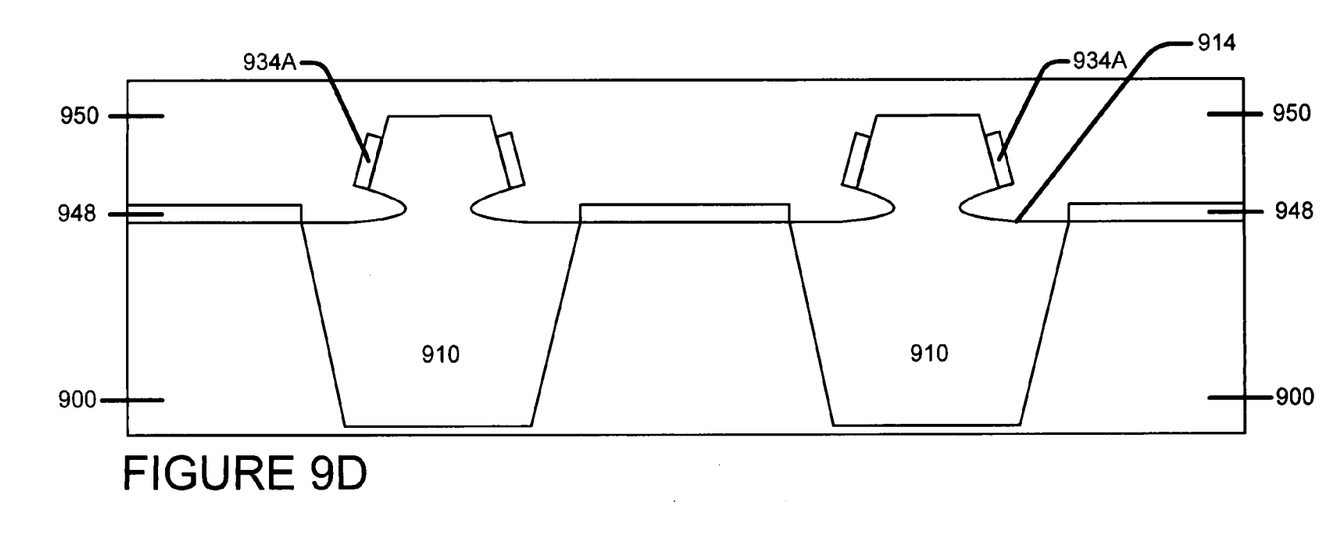

FIG. 9D shows a gate oxidation and poly deposition step to form gate oxide 948 and poly 950. Poly can fill out easily undercut region 914 under the nitride stringer 934A due to its high step coverage.

Figure 9E:
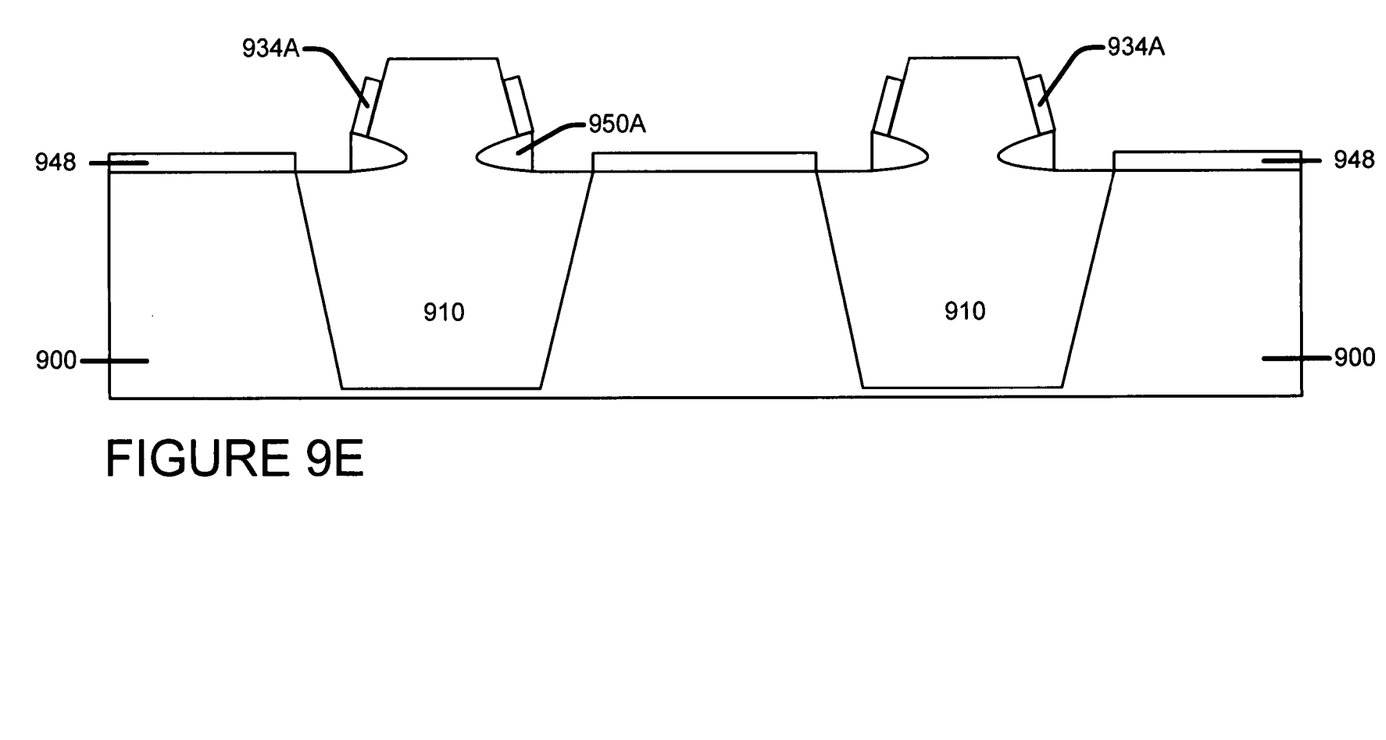

FIG. 9E shows the poly gate patterning step that forms gates (not shown) over active areas and forms poly stringers 950A. The poly stringers can cause the poly bridge problem that causes shorting.

O. Non-Limiting Example Embodiments

In the above description numerous specific details are set forth in order to provide a more thorough understanding of the embodiments of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a device comprising:
providing a substrate with a top substrate surface, the substrate including cell and non-cell regions;

forming a charge storage stack on the substrate, wherein the charge storage stack comprises at least a tunneling layer on the substrate and a storage layer on the tunneling layer;

forming trench isolation regions in the substrate in the cell and non-cell regions, the trench isolation regions having top isolation surfaces coplanar with a top surface of the charge storage stack;

removing portions of the charge storage stack in the non-cell region, wherein removing forms top isolation surfaces in the non-cell region which are coplanar with top substrate surface;

forming a gate dielectric layer in the non-cell region;

forming a gate layer on the substrate over the storage layer and gate dielectric layer in the cell and non-cell regions; and patterning layers on the substrate to form gate stacks in the cell and non-cell regions.

2. The method of claim 1 wherein:

the tunneling layer comprises a tunneling dielectric material; and the storage layer comprises a storage dielectric material.

3. The method of claim 2 comprises a pad layer on the charge storage stack below the gate layer.

4. The method of claim 2 wherein:

the gate stack comprises an insulating layer over the storage layer; and a pad layer on the gate stack below the gate layer.

5. The method of claim 1 wherein:

the tunneling layer comprises silicon oxide or oxynitride; and the storage layer comprises silicon nitride or oxynitride.

6. The method of claim 1 wherein the charge storage stack comprises an insulating layer on the storage layer, the insulating layer comprising an insulating dielectric material.

7. The method of claim 1 comprises a pad layer on the charge storage stack.

8. The method of claim 1 comprises a pad layer on the charge storage stack, the pad layer comprises silicon, including polysilicon, silicide or a combination thereof.

9. The method of claim 1 wherein the gate layer comprises a conductive gate material.

10. The method of claim 9 wherein the conductive gate material comprises polysilicon.

11. The method of claim 1 wherein:

the non-cell region comprises first and second non-cell active regions separated by trench isolation regions; and forming the gate dielectric layer comprises forming first gate dielectric layer having a first thickness in the first non-cell active region, and forming second gate dielectric layer having a second thickness in the second non-cell active region.

12. The method of claim 11 wherein the first thickness and second thickness are different.

13. The method of claim 1 further comprises:

forming source/drain regions adjacent to the gate stack to form transistors; and wherein the cell region comprises a memory cell region.

14. The method of claim 13 wherein:

the non-cell region comprises first and second non-cell active regions separated by trench isolation regions; and forming the gate dielectric layer comprises forming first gate dielectric layer having a first thickness in the first non-cell active region, and forming second gate dielectric layer having a second thickness in the second non-cell active region.

15. A method of fabricating a semiconductor device comprising:

providing a semiconductor substrate with a top substrate surface, the substrate including cell and non-cell regions;

forming a charge storage stack on the substrate, wherein the charge storage stack comprises at least a tunneling layer on the substrate and a storage layer on the tunneling layer;

forming trench isolation regions in the substrate in the cell and non-cell regions, the trench isolation regions having top isolation surfaces coplanar with a top surface of the charge storage stack;

removing portions of the charge storage stack in the non-cell region, wherein removing forms top isolation surfaces which are coplanar with top substrate surface in the non-cell region;

forming a gate dielectric layer in the non-cell region;

forming a gate layer on the substrate over the storage layer and gate dielectric layer in the cell and non-cell regions;

patterning layers on the substrate to form gate stacks in the cell and non-cell regions; and implanting dopants to form source/drain regions adjacent to the gate stacks.

* * * * *